United States Patent
Chen et al.

(10) Patent No.: US 10,748,806 B2
(45) Date of Patent: *Aug. 18, 2020

(54) APPARATUS AND SYSTEM FOR PREVENTING BACKSIDE PEELING DEFECTS ON SEMICONDUCTOR WAFERS

(71) Applicant: TAIWAN SEMICONDUCTOR MANUFACTURING CO., LTD., Hsinchu (TW)

(72) Inventors: Yen-Yu Chen, Taichung (TW); Wei-Jen Chen, Taichung (TW); Yi-Chen Chiang, Taichung (TW); Tsang-Yang Liu, Changhua County (TW); Chang-Sheng Lee, Hsinchu (TW); Wei-Chen Liao, Nantou County (TW); Wei Zhang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/230,765

(22) Filed: Dec. 21, 2018

(65) Prior Publication Data

US 2019/0139810 A1     May 9, 2019

Related U.S. Application Data

(62) Division of application No. 13/929,297, filed on Jun. 27, 2013, now Pat. No. 10,163,676.

(51) Int. Cl.
*H01L 21/687*     (2006.01)

(52) U.S. Cl.
CPC ............... *H01L 21/68742* (2013.01)

(58) Field of Classification Search
CPC . H01L 21/68742; B29C 33/44; B29C 33/442; B29C 33/444; B29C 33/446; B29C 33/46; B29C 2043/5053
See application file for complete search history.

(56) References Cited

U.S. PATENT DOCUMENTS 6,146,463 A * 11/2000 Yudovsky ........... C23C 16/4583
                                                                118/728
6,168,688 B1    1/2001 Clot et al.
(Continued)

FOREIGN PATENT DOCUMENTS

JP         09278179 A      10/1997
KR      20000025662 A       5/2000
(Continued)

*Primary Examiner* — Kambiz Zand
*Assistant Examiner* — Mirza Israr Javed
(74) *Attorney, Agent, or Firm* — Maschoff Brennan

(57) ABSTRACT

A apparatus includes a susceptor and a non-reactive gas source. The susceptor has through holes and a wafer support surface. Each through hole includes a lift pin and a lift pin head. The lift pin has a vertical degree of motion in the through hole to lift up or place a wafer on the susceptor. The lift pin head has at least one flow channel structure running from its first surface at least partially exposed to a bottom side of the susceptor through its second surface exposed to a top side of the susceptor wherein the lift pin. The non-reactive gas source is configured to flow a gas to a backside of the wafer through the flow channel structure through the bottom side of the susceptor.

18 Claims, 10 Drawing Sheets

(56) References Cited

U.S. PATENT DOCUMENTS

| | | | |
|---|---|---|---|
| 6,887,317 B2* | 5/2005 | Or | C23C 16/4401 118/500 |
| 8,845,810 B2* | 9/2014 | Hwang | H01J 37/3244 118/729 |
| 10,262,887 B2* | 4/2019 | Hao | H01L 21/68785 |
| 2003/0178145 A1 | 9/2003 | Anderson et al. | |
| 2005/0000450 A1* | 1/2005 | Iizuka | H01L 21/68742 118/728 |
| 2005/0284577 A1* | 12/2005 | Kwon | B65G 49/065 156/345.51 |
| 2006/0156981 A1* | 7/2006 | Fondurulia | C23C 16/4583 118/715 |
| 2006/0156987 A1* | 7/2006 | Lai | C23C 16/4586 118/728 |
| 2009/0155025 A1* | 6/2009 | Lerner | H01L 21/68742 414/222.01 |
| 2009/0314211 A1* | 12/2009 | Du Bois | H01L 21/68742 118/729 |
| 2010/0086784 A1* | 4/2010 | Patalay | H01L 21/68742 428/411.1 |
| 2010/0159679 A1* | 6/2010 | Wada | C23C 16/4411 438/507 |
| 2011/0033620 A1* | 2/2011 | Polyak | C23C 16/4586 427/248.1 |
| 2011/0164955 A1* | 7/2011 | White | H01L 21/68742 414/800 |
| 2011/0235675 A1* | 9/2011 | Matsudo | H01L 21/67248 374/130 |
| 2012/0227666 A1* | 9/2012 | Kim | C23C 16/458 118/723 R |
| 2014/0000843 A1* | 1/2014 | Dunn | H01L 21/67109 165/80.2 |
| 2014/0265090 A1* | 9/2014 | Hou | H01L 21/68742 269/14 |
| 2014/0265097 A1* | 9/2014 | Cuvalci | B25B 11/00 269/53 |
| 2016/0268157 A1* | 9/2016 | Gong | G02F 1/1303 |

FOREIGN PATENT DOCUMENTS

| | | | |
|---|---|---|---|
| KR | 20090125434 A | * | 12/2009 |
| KR | 20090125434 A | | 12/2009 |
| KR | 20110099478 A | | 9/2011 |

* cited by examiner

APPARATUS AND SYSTEM FOR PREVENTING BACKSIDE PEELING DEFECTS ON SEMICONDUCTOR WAFERS

RELATED APPLICATIONS

This is a divisional application of U.S. patent application Ser. No. 13/929,297 filed on Jun. 27, 2013, now U.S. Pat. No. 10,163,676 issued on Dec. 25, 2018, which is incorporated herein by reference in its entirety.

BACKGROUND

In semiconductor manufacturing, multiple layers (such as a SiN layer, a high-K layer, a poly layer, etc.) are deposited on the front side of a wafer, in which an adhesion layer (such as SiN) plays an important role for adhering the other layers to the wafer. During deposition of the layers, the layers are unintentionally deposited on the backside of the wafer with little or no adhesion layer. After the deposition of the layers, the wafer still needs to undergo several subsequent processes, in which some processes may cause a high stress difference between two adjacent layers, and some processes with high thermal budgets may induce large thermal stress in the layers. Such high stress difference and thermal stress may result in backside peeling defects on the wafer, especially on the region of the backside of the wafer on which little or no adhesion layer is formed. The more the layers are deposited on the backside of the wafer, the higher the peeling defect failure rate will be. Therefore, the backside peeling defects of the wafer can be avoided by preventing the layers from being deposited on the backside of the wafer.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1A:
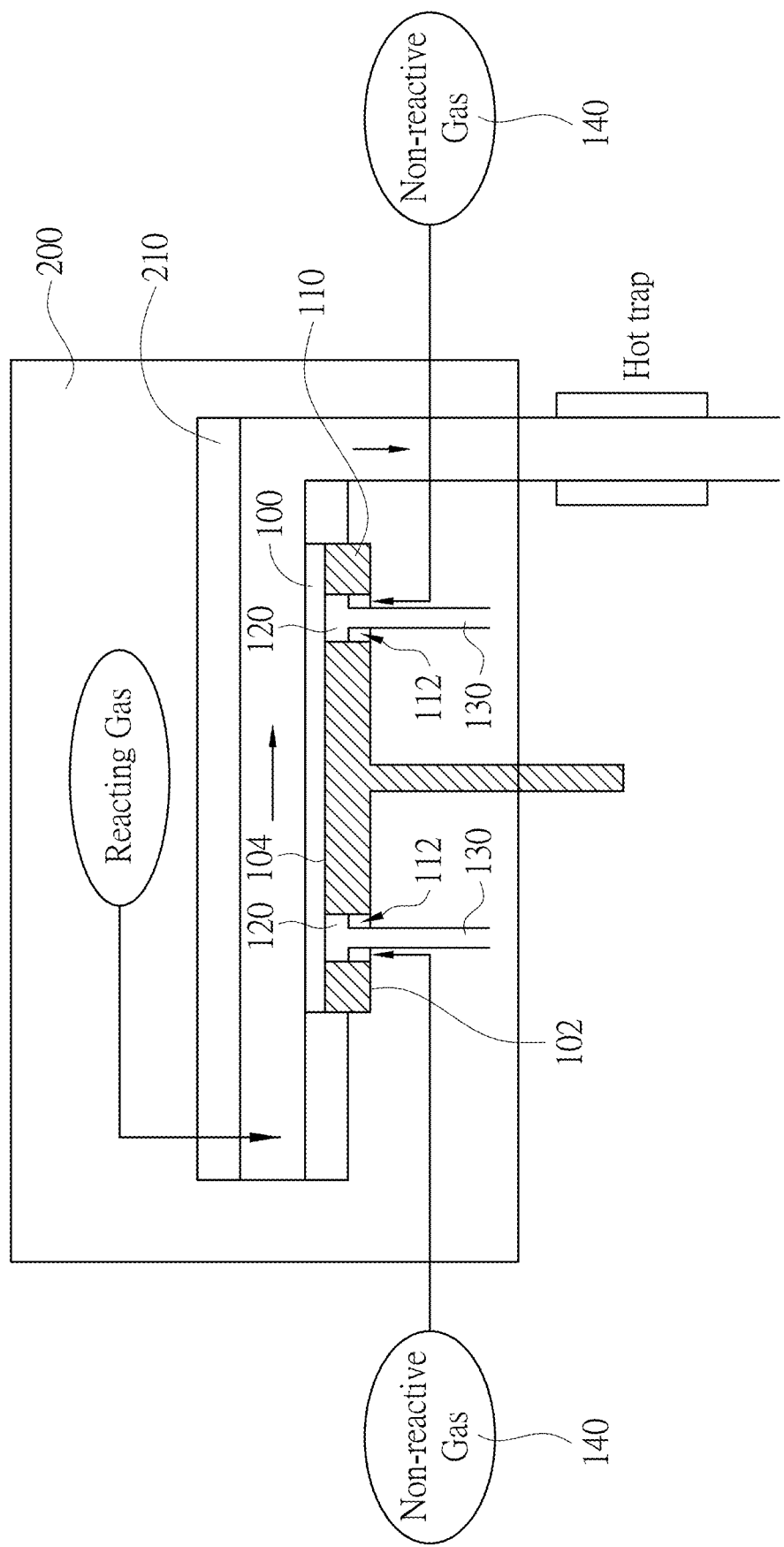
FIG. 1A is a schematic diagram showing a process chamber with a susceptor for various embodiments.

It is understood that the following disclosure provides many different embodiments or examples for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. Moreover, space orientation terms such as "under", "on", "up", etc. are used to describe a relationship between a device or a characteristic and another device or another characteristic in the drawing. It should be noted that the space orientation term can cover different orientations of the device besides the orientation of the device illustrated in the drawing. For example, if the device in the drawing is turned over, the device located "under" the other devices or characteristics is reoriented to be located "above" the other devices or characteristics. Therefore, the space orientation term "under" may include two orientations of "above" and "below".

The present disclosure is to establish a diffusion barrier between a susceptor and a wafer placed on the susceptor to limit or prevent film deposition on the backside of the wafer, such that backside peeling defects of the wafer in the subsequent processes can be reduced or avoided. The susceptor has through holes and lift pins inserted in the through holes. Each lift pin has a lift pin head coupled thereto for raising or lowering the wafer from or on the susceptor. Embodiments of the present disclosure are directed to forming grooves and/or holes on the lift pin heads of the lift pins to intentionally allow a proper amount of gas to flow into the backside of the wafer to form the diffusion barrier.

FIG. 1A is a schematic diagram showing a process chamber 200 with a susceptor 110 for various embodiments of the present disclosure. The process chamber 200, such as an ALD (Atomic Layer Deposition) chamber, disclosed herein is used as an example for explanation, and embodiments of the present disclosure are also applicable to other types of apparatuses. As shown in FIG. 1A, the process chamber 200 includes the susceptor 110, an inner chamber 210 and non-reactive gas sources 140. The susceptor 110 has through holes 112 and a wafer support surface (not labeled) on which a wafer 100 can be placed. In each through hole 112, there are a lift pin 130 and a lift pin head 120 coupled to the lift pin 130. The lift pin 130 is operable to have a vertical degree of motion in the through hole 112 so as to lift up or place the wafer 100 from or on the susceptor 110 via the lift pin head 120 contacting the wafer 100. The lift pin head 120 has at least one flow channel structure. The flow channel structure is used for directing non-reactive gas from the non-reactive gas sources 140 to an area between the susceptor 110 and the backside of the wafer 100.

In contrast to the reacting gas used for forming deposition films, the gas supplied by the non-reactive gas sources 140 does not participate in film forming reactions, such as nitrogen, inert gas (for example, argon), etc. The non-reactive gas sources 140 are configured to flow the gas to the bottom side 102 of the susceptor 110, and then the gas flows to the backside of the wafer 100 through the flow channel structure of each lift pin head 120 by diffusion or injection. In some examples, the non-reactive gas sources 140 are configured to flow the gas to an area under the bottom side 102 of the susceptor 110, so as to establish a higher pressure at the area under the bottom side 102 of the susceptor 110 than a pressure in the inner chamber 210 enclosing the wafer support surface of the susceptor 110, such that the gas can be diffused into the backside of the wafer 100 through the flow channel structure of each lift pin head 120. In certain examples, the non-reactive gas sources 140 are configured to inject the gas to the flow channel structure of each lift pin head 120. The flow rate of the gas should be well controlled not to move or vibrate the wafer. In some embodiments, the pressure difference between the area under the bottom side of the susceptor 110 and the inner chamber 210 is about 0.1-0.2 torr, while the pressure in the process chamber 200 is about 2-3 torr. While in operation, the non-reactive gas sources 140 are configured to establish a diffusion barrier on the backside of the wafer 100, and the reacting gas passing through the front side of the wafer 100 to a hot trap is blocked from entering the backside of the wafer, so as to prevent film deposition on the backside of the wafer 100, thus reducing or avoiding backside peeling defects for the wafer 100 in the subsequent processes.

Figure 1B:
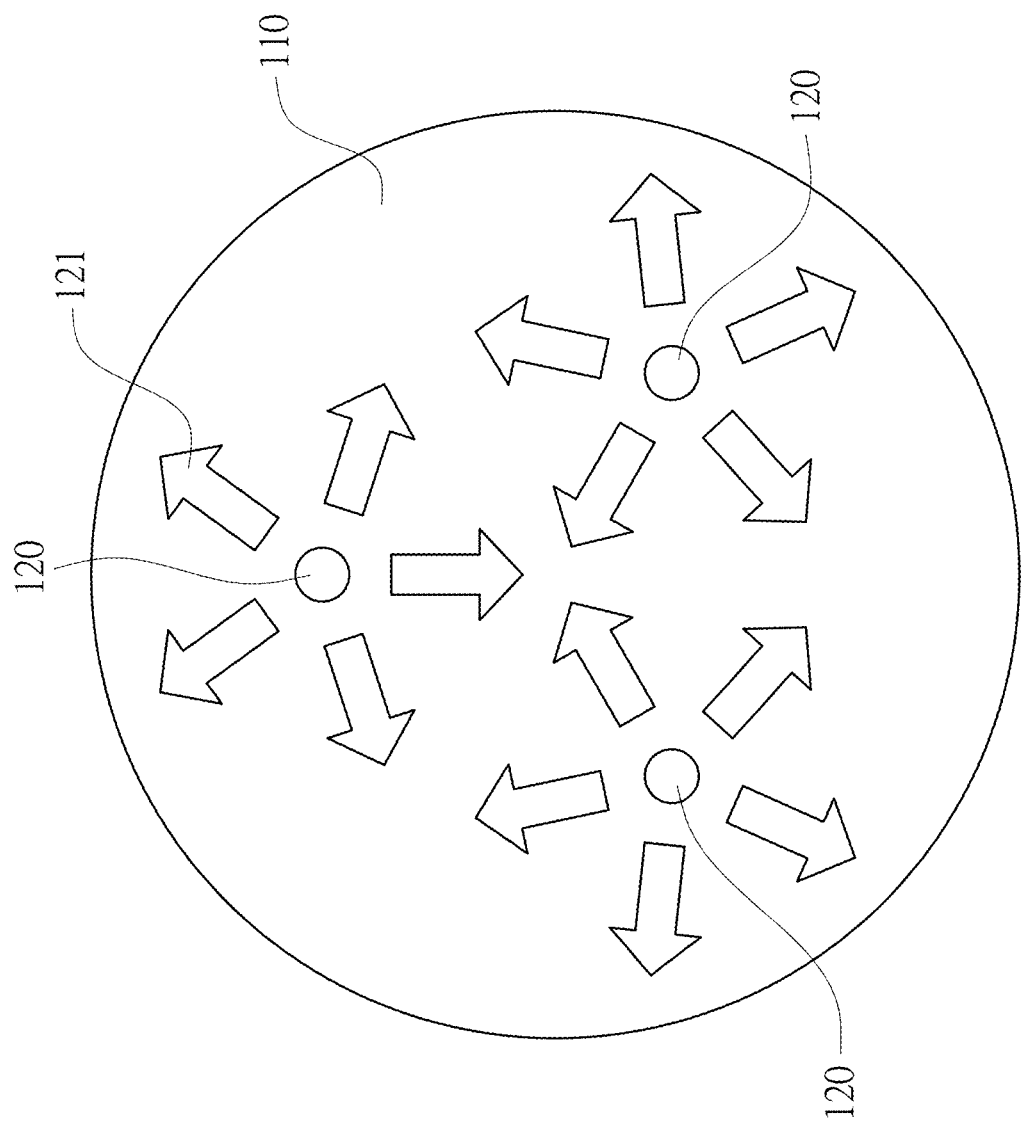
FIG. 1B is a schematic diagram showing a non-reactive gas flow pattern on a wafer support surface of the susceptor depicted in FIG. 1A in accordance with some embodiments.

Referring to FIG. 1A and FIG. 1B, FIG. 1B is a schematic diagram showing a non-reactive gas flow pattern on a wafer support surface of the susceptor 110 in accordance with some embodiments. To minimize the wafer 100 moving or vibrating, the gas establishing the diffusion barrier on the backside of the wafer 100 is flowed in a symmetric pattern with respect to a central axis of the susceptor 110.

As shown in FIG. 1B, three lift pin heads 120 are disposed on the susceptor 110, and each lift pin head has five flow channel structures, as signified by flow arrows 121. The flow channel structures of all of the lift pin heads 120 are disposed symmetrically around the central axis of the susceptor 110, so as to provide a symmetric flow pattern. In some embodiments, the number of the flow channel structures of each lift pin head 120 is greater than two, such as three, five or any number that can enable the flow channel structures of all of the lift pin heads together to provide a symmetric flow pattern. On the other hand, the non-reactive gas flow pattern of the present disclosure is not limited to a symmetric pattern, and the flow channel structures may be uniformly or non-uniformly distributed on one lift pin head 120, as long as the wafer vibration and displacement caused by the gas flow from the flow channel structures can be minimized or none.

Figure 2A:
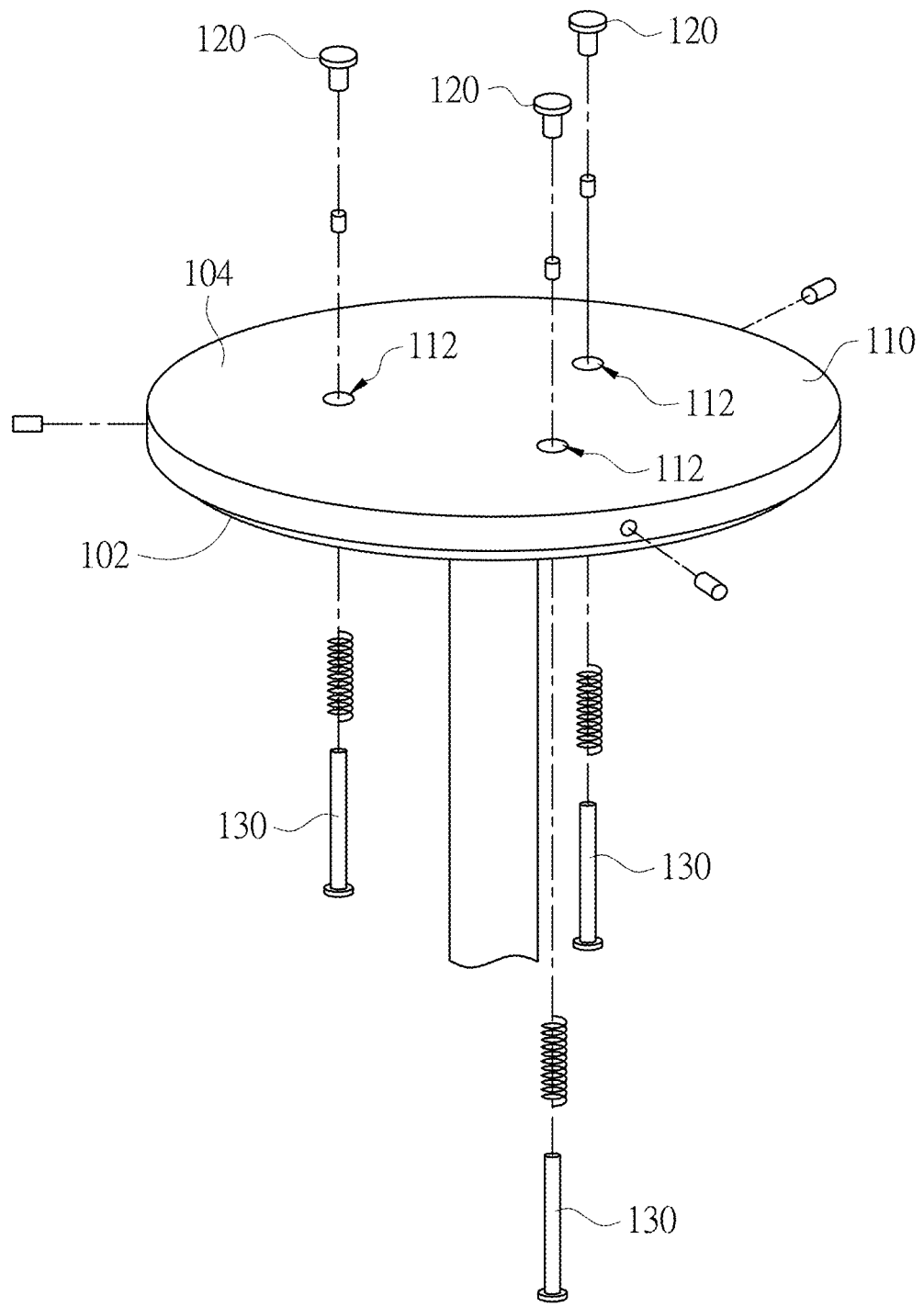
FIG. 2A is a schematic explosive view of an exemplary susceptor depicted in FIG. 1A.
Figure 2B:
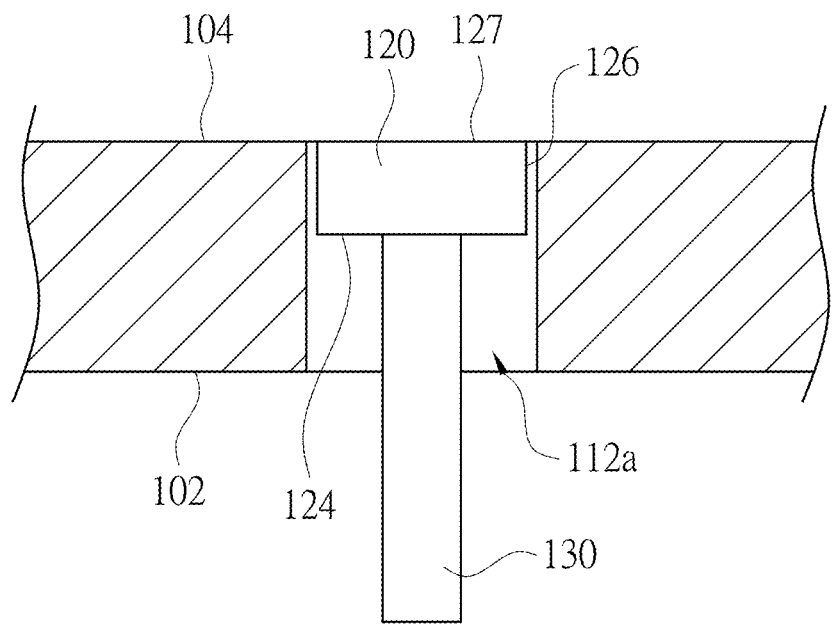
FIG. 2B is a schematic cross-sectional view of the susceptor with a straight through hole in accordance with some embodiments.
Figure 2C:
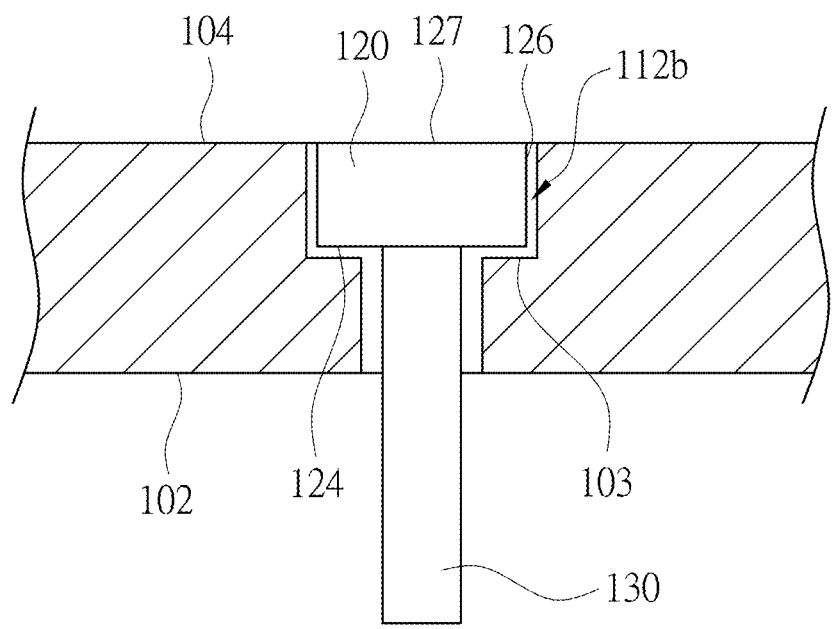
FIG. 2C is a schematic cross-sectional view of the susceptor with a step through hole in accordance with certain embodiments.

As shown in FIG. 2A-FIG. 2C, three lift pin heads 120 and three lift pins 130 are assembled through the through holes 112 of the susceptor 110. The flow channel structure of each lift pin head 120 extends from a bottom surface 124 (i.e. the first surface) of the lift pin head 120 which is at least partially exposed to a bottom side 102 of the susceptor 110 through a side surface 126 or a top surface 127 (i.e. a second surface) of the lift pin head 120 which is exposed to a top side 104 of the susceptor 110. In other words, embodiments of the present disclosure are featured in modifying the lift pin head 120 to form one or more flow channel structures for directing a gas from the non-reactive gas sources 140 to an area between the susceptor 110 and the backside of the wafer 100.

In general, there are two types of through holes 112. As shown in FIG. 2B, the through hole is a straight through hole 112a. In this case, the flow channel structure may be a groove or penetrating hole running from the bottom surface 124 of the lift pin head 120 through the side surface 126 or the top surface 127 of the lift pin head. As shown in FIG. 2C, the through hole is a step through hole 112b, in which the lift pin head 120 may contact a floor 103 of the susceptor 110 to restrict gas flowing through the through hole 112b. In this case, the groove or penetrating hole (flow channel structure) of the lift pin head 120 has to be appropriately formed to prevent the gas from being blocked by the floor 103 of the susceptor 110. Embodiments of the present disclosures are mainly to modify the lift pin head 120 to form a flow channel structure for allowing non-reactive gas to pass through the through hole 112 or the lift pin 130 and the flow channel structure to the top side 104 of the susceptor 110. It is noted that the applications of the embodiments do not need to change the structures of other components in the process chamber besides the lift pin head 120 and in some cases, the lift pin 130.

Hereinafter, several types of flow channel structures are provided as examples for explanation, but embodiments of the present disclosure are not limited thereto.

Figure 3A:
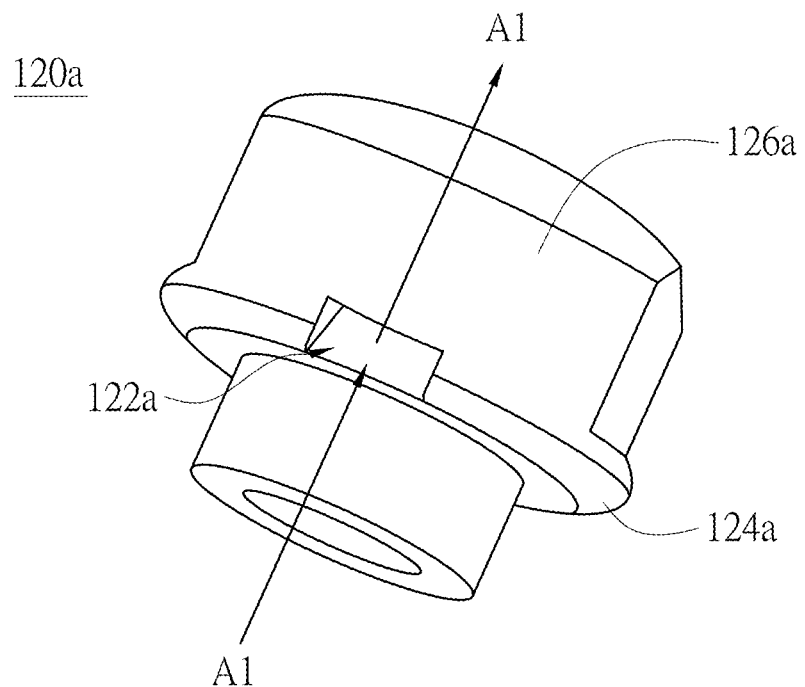
FIG. 3A-FIG. 3D are schematic diagrams showing exemplary types of lift pin heads.

FIG. 3A-FIG. 3D are schematic diagrams showing exemplary types of lift pin heads. In some embodiments, the lift pin head 120 has a flange around its sidewall. However, the lift pin head with no flange is also applicable to embodiments of the present disclosure, i.e. the lift pin head and the lift pin are of the same outer diameter. As shown in FIG. 3A, a flow channel structure of a lift pin head 120a is a groove 122a cut into a bottom surface 124a and a small portion of width of a side surface 126a, such that non-reactive gas may flow along a direction A1 to a wafer. Since there is little or no room between the susceptor and the lift pin head 120a, the non-reactive gas exiting from the groove 122a will be guided by the susceptor towards the top side of the susceptor.

Figure 3B:
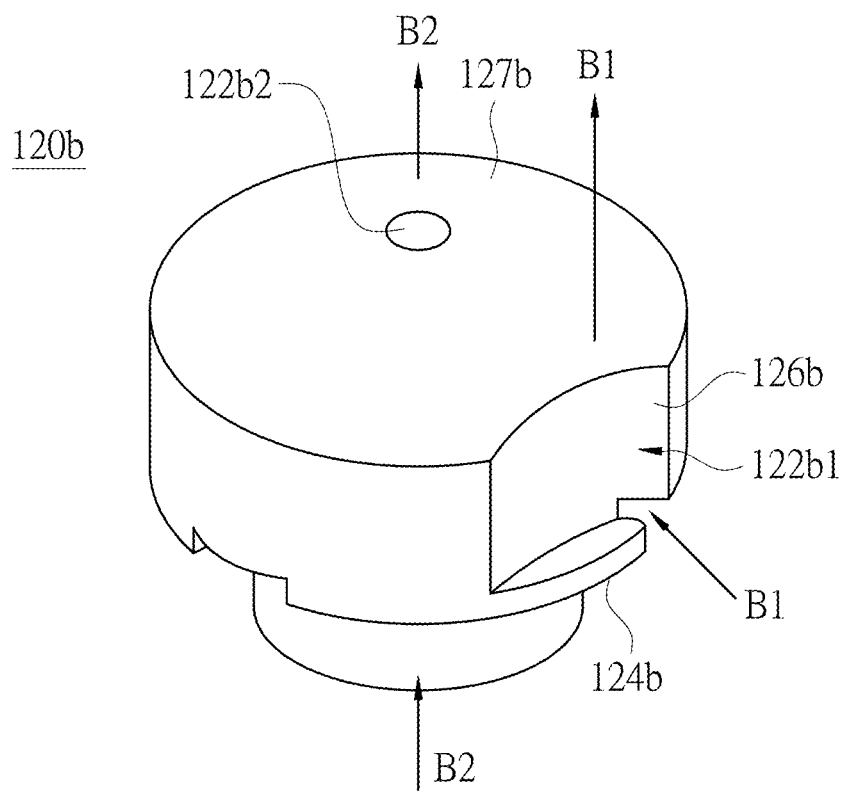

As shown in FIG. 3B, besides the flow channel structure similar to the one shown in FIG. 3A, a lift pin head 120b has another two types of flow channel structures. One type of flow channel structure is a groove 122b1 extending from a bottom surface 124b of the lift pin head 120b through a side surface 126b of the lift pin head 120b to a top surface 127b of the lift pin head 120b, such that non-reactive gas may flow along a direction B1 to a wafer. The other type of flow channel structure is a penetrating hole 122b2 running from the corresponding lift pin through the top surface 127b of the lift pin head 120b. In this case, the corresponding lift pin also has a penetrating hole aligned with the penetrating hole 122b2, such that non-reactive gas may flow along a direction B2 to a wafer.

Figure 3C:
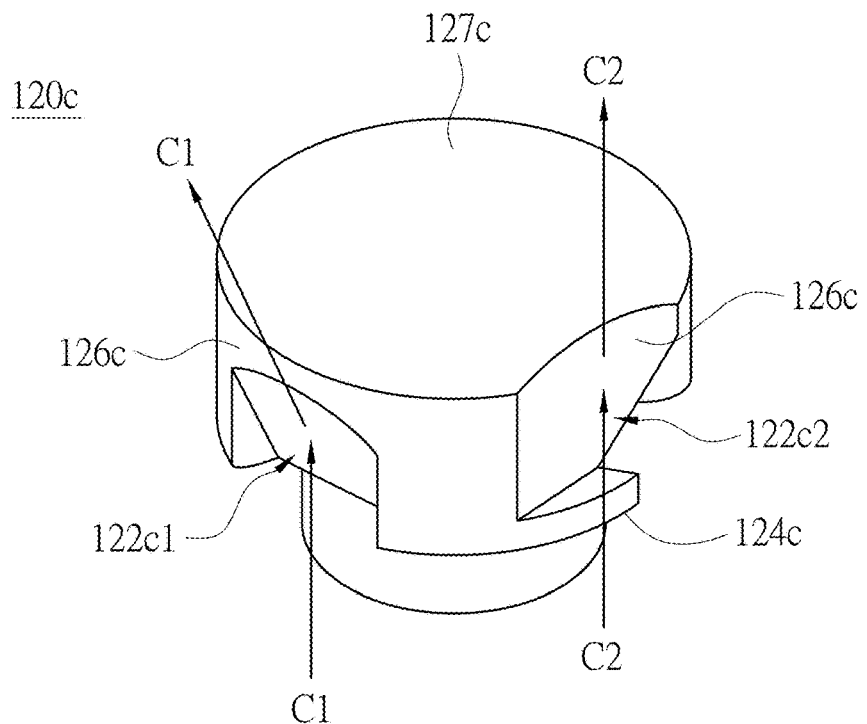

As shown in FIG. 3C, a lift pin head 120c has two types of flow channel structures. One type of flow channel structure is a groove 122c1 cut into a bottom surface 124c and a large portion of width of a side surface 126c, such that non-reactive gas may flow along a direction C1 to a wafer. The other type of flow channel structure is a groove 122c2 extending from the bottom surface 124c through the side surface 126c to a top surface 127c of the lift pin head 120c, such that non-reactive gas may flow along a direction C2 to a wafer.

Figure 3D:
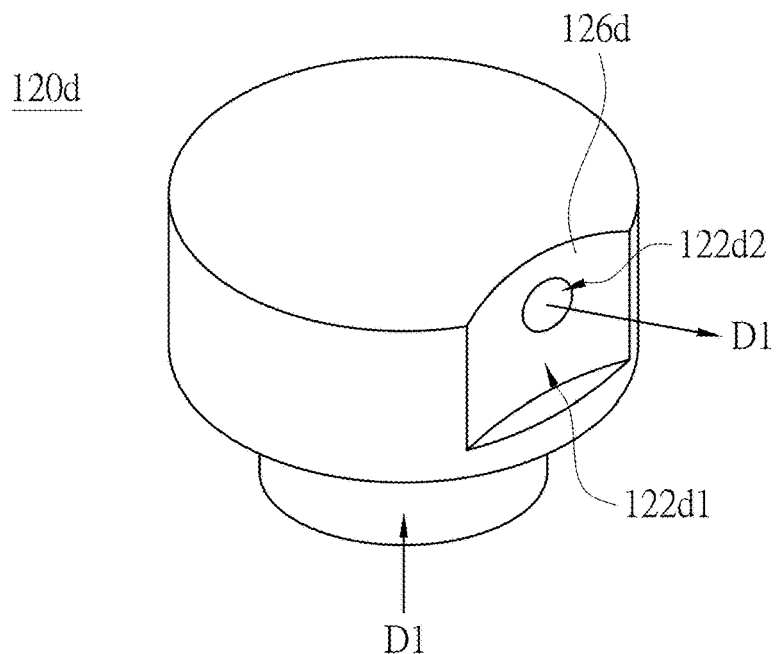

As shown in FIG. 3D, a flow channel structure of a lift pin head 120*d* is a combination of a groove 122*d*1 and a penetrating hole 122*d*2, in which the groove 122*d*1 is cut into a side surface 126*d* and the penetrating hole 122*d*2 is formed in the groove 122*d*1. In this case, the corresponding lift pin also has a penetrating hole aligned with the penetrating hole 122*d*2, such that non-reactive gas may flow along a direction D1 to a wafer.

Figure 4A:
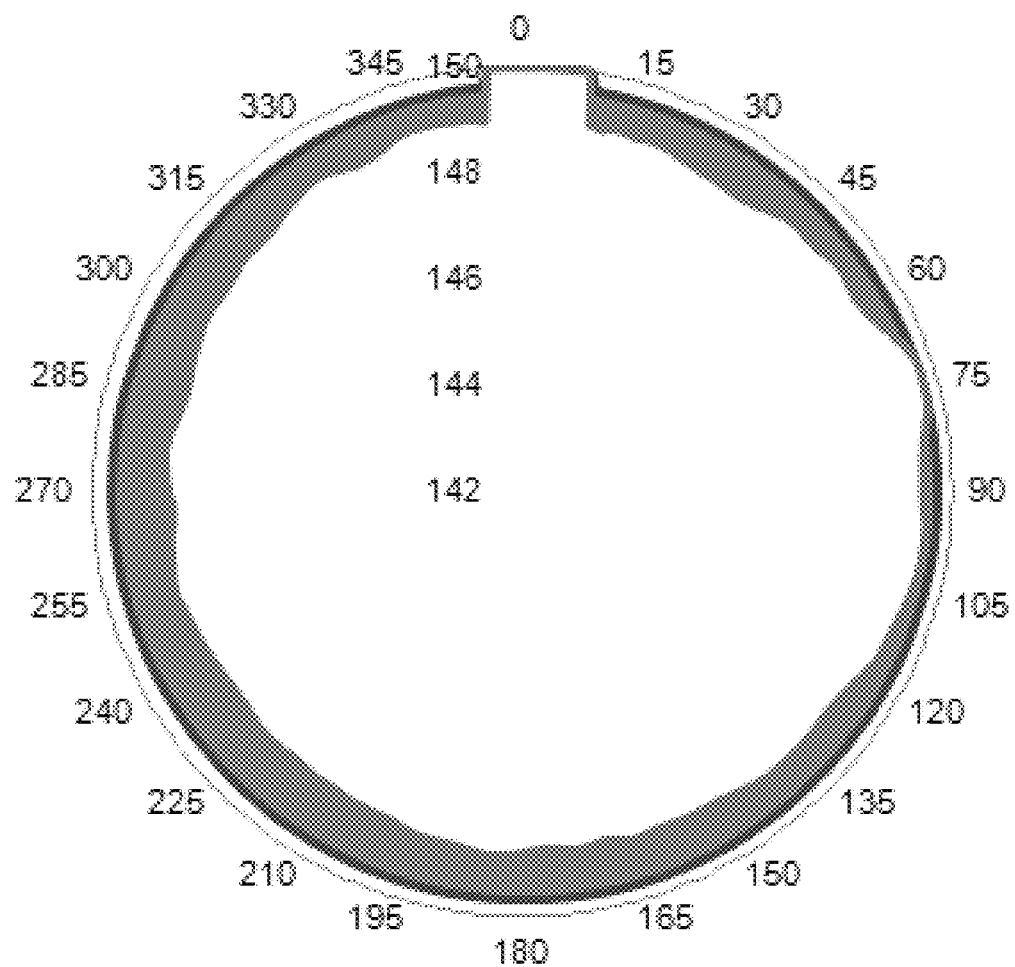
FIG. 4A is an inspection result of film deposition on the backside of a wafer when conventional lift pin heads are used.
Figure 4B:
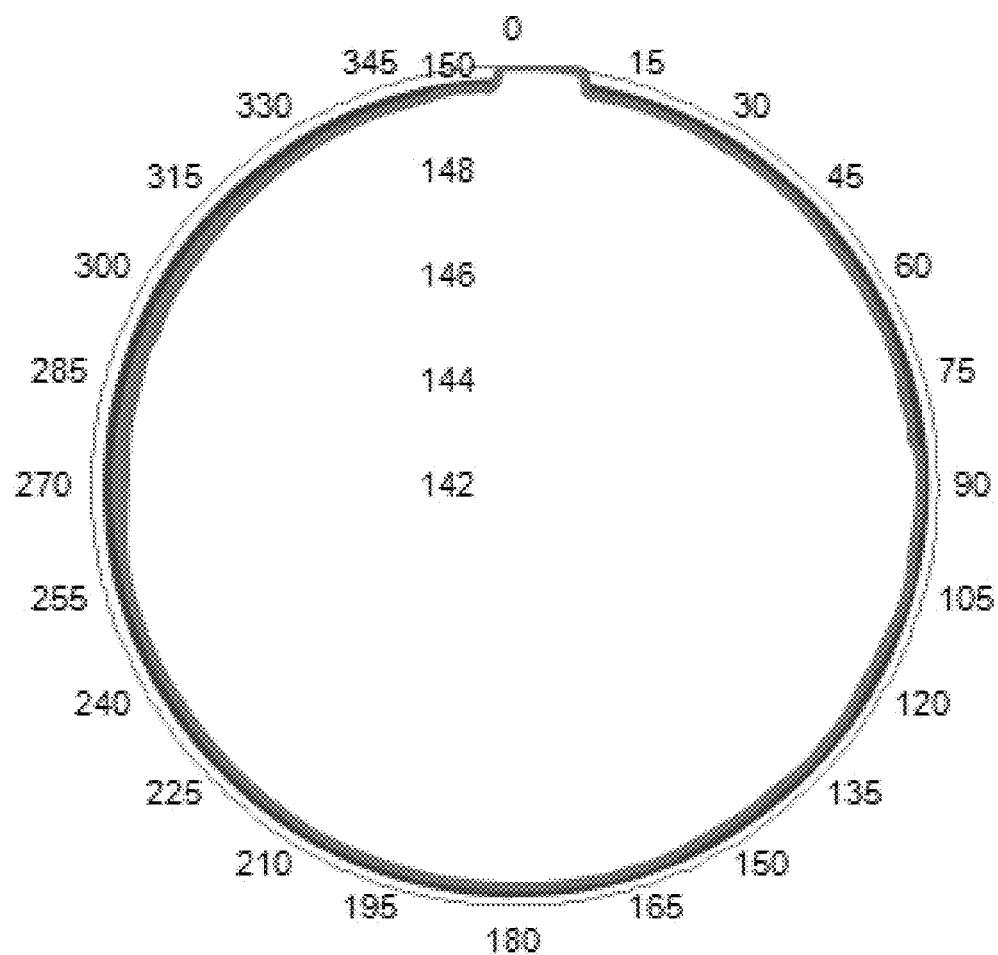
FIG. 4B is an inspection result of film deposition on the backside of a wafer when lift pin heads with flow channel structures shown in FIG. 3A are used.

FIG. 4A is an inspection result of film deposition on the backside of a wafer when conventional lift pin heads are used. FIG. 4B is an inspection result of film deposition on the backside of a wafer when lift pin heads with flow channel structures shown in FIG. 3A are used. The film deposition is indicated by shadow areas shown in the figures. Comparing FIG. 4A and FIG. 4B, the apparatus using the lift pin heads with flow channel structures has much less film deposition on the backside of a wafer than that using the conventional lift pin heads. Thus, backside peeling defects of the wafer in subsequent processes can be reduced or avoided.

Figure 5:
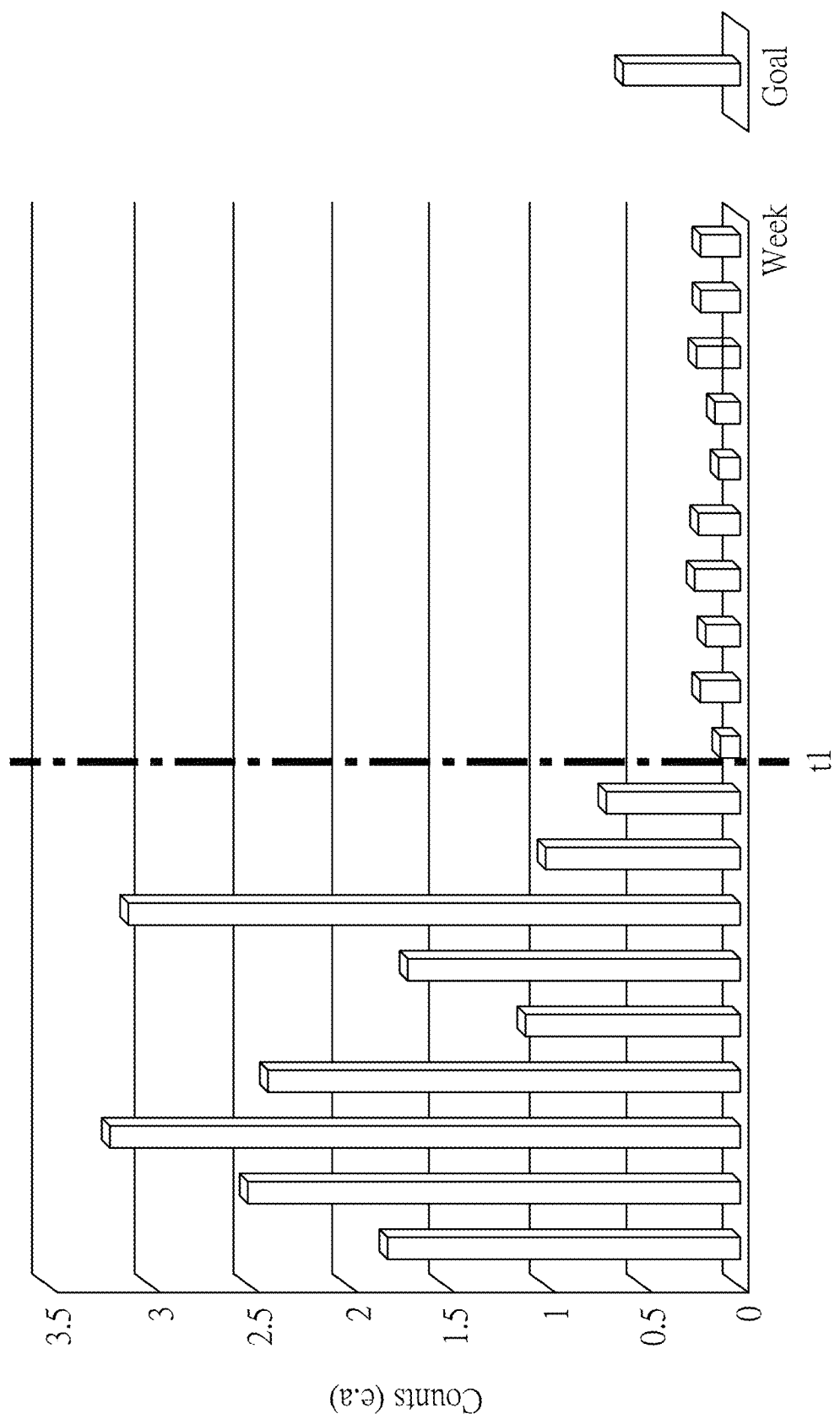
FIG. 5 is a defect trend chart showing a backside peeling defect trend when lift pin heads with flow channel structures shown in FIG. 3A are used.

FIG. 5 is a defect trend chart showing a backside peeling defect trend when lift pin heads with flow channel structures shown in FIG. 3A are used. At week t1, the lift pin heads with the flow channel structures shown in FIG. 3A are used to replace the conventional lift pin heads for production. As shown in FIG. 5, the defect counts per wafer are greatly reduced and meet the defect count goal at and after week t1.

Figure 6:
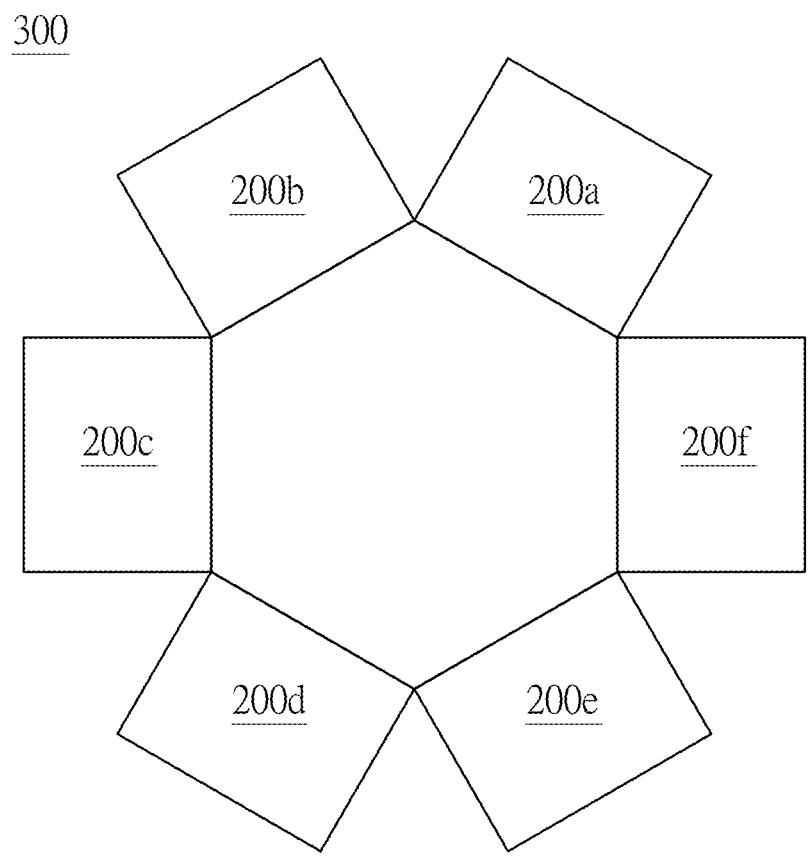
FIG. 6 is a schematic diagram showing a multi-chamber processing system in accordance with various embodiments.

FIG. 6 is a schematic diagram showing a multi-chamber processing system 300 in accordance with various embodiments. As shown in FIG. 6, the multi-chamber processing system 300 (such as a cluster tool) includes multiple process chambers 200*a*-200*f*, in which each of the process chambers 200*a*-200*f* has the lift pin heads with flow channel structures in accordance with the aforementioned embodiments.

In accordance with some embodiments, the present disclosure discloses an apparatus including a susceptor and a non-reactive gas source. The susceptor has through holes and a wafer support surface. Each through hole includes a lift pin and a lift pin head. The lift pin has a vertical degree of motion in the through hole, and is operable to lift up or place a wafer on the susceptor. The lift pin head is disposed on the lift pin and has at least one flow channel structure running from its first surface at least partially exposed to a bottom side of the susceptor through its second surface exposed to a top side of the susceptor. The non-reactive gas source is configured to flow a gas to the bottom side of the susceptor.

In accordance with certain embodiments, the present disclosure discloses a system includes at least one apparatus, and each apparatus includes a susceptor, a non-reactive gas source and an inner chamber. The susceptor has through holes and a wafer support surface. The inner chamber encloses the wafer support surface of the susceptor. Each through hole includes a lift pin and a lift pin head. The lift pin has a vertical degree of motion in the through hole, and is operable to lift up or place a wafer on the susceptor. The lift pin head is disposed on the lift pin and has at least one flow channel structure running from its first surface at least partially exposed to a bottom side of the susceptor through its second surface exposed to a top side of the susceptor wherein the lift pin. The non-reactive gas source is configured to flow a gas to the bottom side of the susceptor.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus, comprising:
a holder having a through hole and a wafer support surface, wherein the through hole is a step through hole, and a floor of the holder is disposed in the step through hole;
a lift pin received in the step through hole and having a vertical degree of motion;
a lift pin head received in the step through hole, on the lift pin and having at least one flow channel structure running from a first surface of the lift pin head that has a first portion opposing the floor of the holder and a second portion exposed by the step through hole adjacent to a bottom side of the holder to a second surface of the lift pin head, wherein the lift pin is operable to lift up or place a wafer on the holder; and
a non-reactive gas source configured to flow a gas into the step through hole,
wherein:
the lift pin head has an outer bottom surface, a top surface, and an outer sidewall connected between the outer bottom surface and the top surface,
one of the at least one flow channel structure is disposed near or on the outer sidewall and runs from the outer bottom surface that is at least partially exposed to a bottom side of the holder via the step through hole of the holder through the top surface or the outer sidewall that is exposed to a top side of the holder,
the lift pin is operable to lift up or place the wafer on the holder via the lift pin head contacting the wafer,
an outer diameter of the lift pin head is greater than an outer diameter of the lift pin, and
the one of the at least one flow channel structure includes a groove extending from the outer bottom surface of the lift pin head through a surface of the outer sidewall of the lift pin head to the top surface of the lift pin head.

2. The apparatus of claim 1, wherein the second surface is a side surface of the lift pin head.

3. The apparatus of claim 1, wherein the second surface is a top surface of the lift pin head.

4. The apparatus of claim 1, wherein the at least one flow channel structure is at least one groove for allowing the gas to pass through.

5. The apparatus of claim 1, wherein the at least one flow channel structure is a groove cut into a bottom surface of the lift pin head and an outer sidewall of the lift pin head for allowing the gas to pass through.

6. The apparatus of claim 1, further comprising: an inner chamber enclosing the wafer support surface of the holder, wherein the holder is a susceptor.

7. The apparatus of claim 6, wherein the non-reactive gas source is configured to establish a higher pressure at an area under the bottom side of the holder than a pressure in the inner chamber.

8. The apparatus of claim 1, wherein the number of the at least one flow channel structure is greater than two, and the flow channel structures are disposed symmetrically around a central axis of the holder.

9. An apparatus, comprising:
a holder having a plurality of through holes and a wafer support surface, wherein each of the through holes is a step through hole, and each of the plurality of through holes includes:
a lift pin having a vertical degree of motion; and
a lift pin head on the lift pin, the lift pin head having an outer bottom surface, a top surface, an outer sidewall connected between the outer bottom surface and the top surface, and at least one flow channel structure, one of the at least one flow channel structure is disposed near or on the outer sidewall and runs from the outer bottom surface that is at least partially exposed to a bottom side of the holder via the through hole of the holder through the top surface or the outer sidewall that is exposed to a top side of the holder, wherein the lift pin is operable to lift up or place a wafer on the holder via the lift pin head contacting the wafer, an outer diameter of the lift pin head is greater than an outer diameter of the lift pin, and the one of the at least one flow channel structure includes a groove extending from the outer bottom surface of the lift pin head through a surface of the outer sidewall of the lift pin head to the top surface of the lift pin head; and
a non-reactive gas source configured to flow a gas to the bottom side of the holder.

10. A system, comprising:
at least one apparatus, each of the least one apparatus comprising:
a holder having a through hole and a wafer support surface, wherein the through hole is a step through hole,
a lift pin received in the step through hole and having a vertical degree of motion;
a lift pin head received in the step through hole, on the lift pin and having at least one flow channel structure running from a first surface of the lift pin head to a second surface of the lift pin head, wherein the lift pin is operable to lift up or place a wafer on the holder, and the first surface of the lift pin head extends laterally beyond an outer sidewall surface of the lift pin; and
a non-reactive gas source configured to flow a gas to a bottom side of the holder;
wherein:
the lift pin head has an outer bottom surface, a top surface, and an outer sidewall connected between the outer bottom surface and the top surface, one of the at least one flow channel structure is disposed near or on the outer sidewall and runs from the outer bottom surface that is at least partially exposed to die bottom side of the holder via the through hole of the holder through the top surface or the outer sidewall that is exposed to a top side of the holder,
the lift pin is operable to lift up or place a wafer on the holder via the lift pin head contacting the wafer, an outer diameter of the lift pin head is greater than an outer diameter of the lift pin, and the one of the at least one flow channel structure includes a groove extending from the outer bottom surface of the lift pin head through a surface of the outer sidewall of the lift pin head to the top surface of the lift pin head.

11. The system of claim 10, wherein the second surface is a side surface or a top surface of the lift pin head.

12. The system of claim 10, wherein the at least one flow channel structure is at least one groove or penetrating hole for allowing the gas to pass through.

13. The system of claim 10, wherein the at least one flow channel structure is at least one groove through a flange around a sidewall of the lift pin head.

14. The system of claim 10, wherein the at least one flow channel structure comprises a groove cut into an outer sidewall of the lift pin head and a hole at least in the lift pin head, and an opening of the hole is on a sidewall of the groove for allowing the gas to pass through, the groove only extending a partial distance along a vertical exterior surface of the lift pin head.

15. The system of claim 10, further comprising: an inner chamber enclosing the wafer support surface of the holder, wherein the holder is a susceptor.

16. The system of claim 15, wherein the non-reactive gas source is configured to establish a higher pressure at an area under the bottom side of the holder than a pressure in the inner chamber.

17. The system of claim 10, wherein the number of the at least one flow channel structure is greater than two, and the flow channel structures of all of the lift pin heads are disposed symmetrically around a central axis of the holder.

18. The apparatus of claim 1, wherein the lift pin head has a sidewall that slants inwardly in a direction from a top to a bottom of the sidewall of the lift pin head and defines the at least one flow channel structure.

* * * * *